United States Patent [19]
Gotou et al.

[11] Patent Number: 5,478,971
[45] Date of Patent: Dec. 26, 1995

[54] METALLIC CIRCUIT BOARD AND THIN FILM DIODE ARRAY AND METHOD OF MANUFACTURING THE SAME

[75] Inventors: Masahito Gotou; Kiyoshi Okano, both of Tenri, Japan

[73] Assignee: Sharp Kabushiki Kaisha, Osaka, Japan

[21] Appl. No.: 283,227

[22] Filed: Jul. 29, 1994

[30]  Foreign Application Priority Data

Jul. 30, 1993 [JP] Japan ..................... 5-190073

[51] Int. Cl.⁶ ..................... H05K 1/00
[52] U.S. Cl. ............ 174/250; 174/256; 174/260; 361/760
[58] Field of Search ............... 174/250, 256, 174/260; 428/901; 361/748, 760, 784, 792

[56] References Cited

U.S. PATENT DOCUMENTS

| | | |
|---|---|---|
| 4,800,345 | 1/1989 | Podell et al. . |
| 5,226,841 | 7/1993 | Thorner . |
| 5,227,663 | 7/1993 | Patil et al. . |
| 5,296,653 | 3/1994 | Kiyota et al. . |

FOREIGN PATENT DOCUMENTS

| | | |
|---|---|---|
| 3-005072B2 | 7/1982 | Japan . |
| 5-027269A | 2/1993 | Japan . |

*Primary Examiner*—Morris H. Nimmo
*Assistant Examiner*—Cheryl R. Figlin
*Attorney, Agent, or Firm*—David G. Conlin; Milton Oliver

[57]  ABSTRACT

An object of the invention is to economically and easily manufacture a thin film diode of back-to-back connection type having a symmetric voltage-ampere characteristic. First conducting layers of a metallic circuit board to become a wiring and an island conductor, respectively, are electrically connected with each other via a second conducting layer. The first conducting layers are electrically isolated from each other by anodizing the second conducting layer. An anodized insulating layer is formed by oxidized parts of the first conducting layers and the oxidized second conducting layer. The not-anodized part of one of the first conducting layers becomes a wiring and the not-anodized part of the other of the first conducting layers becomes an island conductor. The island conductor is considered as a first conductor and second and third conductors are formed on the anodized insulating layer on the first conductor. Thereby, a two-terminal element of a back-to-back type is completed.

7 Claims, 14 Drawing Sheets

METALLIC CIRCUIT BOARD AND THIN FILM DIODE ARRAY AND METHOD OF MANUFACTURING THE SAME

BACKGROUND OF THE INVENTION

1. Field of the Invention

The present invention relates to a metallic circuit board used as an electronic circuit board and a method of manufacturing the same and more particularly to a thin film diode array (e.g., active matrix type) applied to a liquid crystal display apparatus.

2. Description of the Related Art

Liquid crystal displays which are roughly classified into a single-matrix- and an active-matrix-type, recently attract a great deal of attention. In particular, since the active-matrix-type liquid crystal display apparatus is capable of perfect and independent switching of liquid crystal and of displaying a high quality image on a large image plane, the research and development thereof has been actively proceeded. Further, the active-matrix-type is mainly classified into two types. Namely, one is a liquid crystal display apparatus using an element called thin film transistor (hereinafter abbreviated as "TFT") and the other is that using an element called thin film diode (hereinafter abbreviated as "TFD"), and these two kinds of elements are called active element.

The liquid crystal display apparatus using a TFD is expected to steadily grow in the industry. This is because, though it is inferior to one using a TFT in image quality, it is inexpensive and suit for mass production owing to its simplification in construction.

An example of a conventional TFD array is shown in FIGS. 16, 17. FIG. 16 is a partial plan view showing a constitution of the TFD array. FIG. 17 is a sectional view taken on line V—V of FIG. 16.

The TFD array is manufactured as follows.

First, tantalum is applied by spattering to one surface of a glass substrate 21 to form a tantalum layer having a predetermined shape and the tantalum layer is anodized up to a predetermined depth from the surface of the layer to form an insulating film 24. Not-anodized parts of the tantalum layer form a lower electrode 22 and a lower wiring portion 23. The insulating film 24 can be also formed by the application of $Ta_2O_5$ or $SiN_x$ by the use of a spattering or P-CVD method to the entire surface of the substrate coated with tantalum.

Further, an electroconductive film of a metal such as Al, Ti, ITO etc. or an oxide is laminated on the insulating film 24 on the lower electrode 22 to form an upper electrode 25. A part of the one surface of the glass substrate 21 is coated with a metal such as ITO so as to contact with the upper electrode 25 and thereby a picture element electrode 26 is formed. In the case where the upper electrode 25 is made of electroconductive oxide film, the upper electrode 25 itself can be also used as the picture element electrode 26.

A liquid crystal display apparatus using a TFD element is driven by applying a voltage to liquid crystal molecules via picture signals inputted through the TFD element and via vertical scanning signals inputted from transparent wirings formed on the substrates opposed to each other.

The most famous TFD liquid crystal display element is of a metal-insulator-metal (hereinafter abbreviated as MIM) constitution type wherein $Ta_2O_5$ formed by anodization is used as a TFD element. The MIM element is relatively good in symmetry of voltage-ampere characteristic on a positive-voltage and a negative-voltage side on applying a voltage, and excellent in uniformity. Accordingly, it is only the MIM element among TFD liquid crystal display elements that was entered into the market.

The symmetry of the voltage-ampere characteristic, however, is not complete even in the MIM element yet, and therefore flickering and image fixing, which are causes of after-image etc., occur easily. A solution proposed in order to improve the symmetry of voltage-ampere characteristic is to connect two MIM elements with each other in series in a backward direction, that is a back-to-back constitution. However, in prior art (Japanese Examined Patent Publication JP(B2) 3-5072 (1991) etc.), it is impossible to eliminate dry etching for removing an anodized $Ta_2O_5$ film. That causes the lowering of throughput and as a result leads to the increase of manufacturing cost.

Further, also a method for manufacturing a diode with a back-to-back constitution wherein an anodized film is employed instead of dry etching has been invented (Japanese Unexamined Patent Publication JPA 5-27269 (1993)). However, in the method, since a wiring, a connection and a MIM element are formed at the same time, the connection is formed in the quite same film thickness as those of the wiring and the MIM element. Accordingly, when the wiring and the MIM element are separated, not only the anodization from a side direction, but also applying a high voltage is required. At that time, peeling of resist and the like may be caused. Additionally, the anodized film has a limitation in thickness and a metallic portion between the wiring and the MIM element to be oxidized should be a line with a width of 1 μm or less in order to be subjected to oxidation. That is very difficult in view of the patterning accuracy and is not practical.

SUMMARY OF THE INVENTION

An object of the invention is to provide a metallic circuit board and a thin film diode array which are manufactured in a relatively easy and practical anodization method and to provide a method of manufacturing the same.

The invention provide a metallic circuit board comprising an insulating substrate, a wiring formed in a predetermined pattern on the insulating substrate, an island conductor formed on the insulating substrate leaving a predetermined space from the wiring, and an anodized insulating layer enveloping the entire surfaces of the wiring and the island conductor and an insulating substrate surface between the wiring and the island conductor.

Further, the invention provides a manufacturing method of a metallic circuit board wherein on an insulating substrate are formed, at least, a wiring in a predetermined pattern, an island conductor leaving a predetermined space from the wiring, an insulating layer enveloping the entire surfaces of the wiring and the island conductor, and an insulating substrate surface between the wiring and the island conductor, the method comprising the steps of:

(a) forming first conducting layers in respective regions where the wiring and the island conductor are to be formed on the insulating substrate.

(b) forming a second conducting layer extending from the first conducting layer formed in the region where the wiring is to be formed to the first conducting layer formed in the region where the island conductor is to be formed, and (c) anodizing the second conducting layer by using the second conducting layer as an anode until the second conducting layer is completely oxidized.

The invention is characterized in that the second conducting layer is formed so as to envelope a the entire surface of the first conducting layer formed in the region where the wiring is to be formed and the entire surface of the first conducting layer in the region where the island conductor is to be formed.

The invention is characterized in that the second conducting layer is formed so as to envelope a part of the surface of the first conducting layer formed in the region where the wiring is to be formed and part of the surface of the first conducting layer in the region where the island conductor is to be formed and so as to have a smaller thickness than those of the first conducting layers.

The invention provides a manufacturing method of a metallic circuit board wherein on an insulating substrate are formed, at least, a wiring in a predetermined pattern, an island conductor leaving a predetermined space from the wiring, and an insulating layer enveloping the entire surfaces of the wiring and the island conductor and an insulating substrate surface between the wiring and the island conductor, the method comprising the steps of:

(a) forming a first conducting layer extending from a region on the insulating substrate where the wiring is to be formed to a region on the insulating substrate where the island conductor is to be formed on the insulating substrate;

(b) forming second conducting layers thicker than the first conducting layer in respective regions where the wiring and the island conductor are to be formed on the insulating substrate; and (c) anodizing by using the first and second conducting layers as an anode until part of the first conducting layer whose surfaces is exposed is completely oxidized in a thickness direction.

The invention provides a thin film diode array comprising:

an insulating substrate;

a first wiring formed in a predetermined pattern on the insulating substrate;

a first anodized insulating layer enveloping the first wiring;

a second anodized wiring formed so as to overlap the first anodized insulating layer;

an electrode to which signals from the second wiring are applied; and a diode element for providing and interrupting the signals to be applied to the electrode, the diode element including;

a first conductor formed on the insulating substrate leaving a predetermined space from the first wiring;

a second anodized insulating layer enveloping the first conductor;

a second conductor formed on the second anodized insulating layer and connected to the second wiring; and a third conductor formed on the second anodized insulating layer with keeping electrical isolation from the second conductor and connected to the electrode.

The invention provides a manufacturing method of a thin film diode array wherein on an insulating substrate are formed a first wiring in a predetermined pattern, a first insulating layer enveloping the first wiring, a second wiring overlapping the first insulating layer, an electrode to which signals from the second wiring are applied, and a diode element composed of a first conductor for providing and interrupting the signals, leaving a predetermined space from the first wiring, a second insulating layer enveloping the first conductor, a second conductor provided on the second insulating layer and connected to the second wiring, and a third conductor provided on the second insulating layer with keeping the electrical isolation from the second conductor and connected to the electrode, the method comprising the steps of:

(a) forming first conducting layers in respective regions where the first wiring and the first conductor are to be formed on the insulating substrate;

(b) forming a second conducting layer extending from the first conducting layer formed in the region where the first wiring is to be formed to the first conducting layer formed in the region the first conductor is to be formed;

(c) anodizing the second conducting layer by using the second conducting layer as an anode until the second conducting layer is completely oxidized and forming the first wiring, the first conductor, the first insulating layer and the second insulating layer;

(d) forming the second wiring so as to overlap the first insulating layer;

(e) forming the second- and the third-conductor on the second insulating layer; and (f) forming the electrode on the remaining part of the insulating substrate.

The invention provides a manufacturing method of a thin film diode array wherein on an insulating substrate are formed a first wiring in a predetermined pattern, a first insulating layer enveloping the first wiring, a second wiring overlapping the first insulating layer, an electrode to which signals from the second wiring are applied, and a diode element composed of a first conductor for providing and interrupting the signals, leaving a predetermined space from the first wiring, a second insulating layer enveloping the first conductor, a second conductor provided on the second insulating layer and connected to the second wiring, and a third conductor provided on the second insulating layer with keeping the electrical isolation from the second conductor and connected to the electrode, the method comprising the steps of:

(a) forming a first conducting layer extending from the region where the wiring is to be formed on the insulating substrate to the region where the first conductor is to be formed on the insulating substrate;

(b) forming second conducting layers thicker than the first insulating layer in the respective regions where the first wiring is to be formed and the first conductor is to be formed on the insulating substrate;

(c) anodizing by using the second and first conducting layers as an anode until part of the first conducting layer whose surface is exposed is completely oxidized and forming the first wiring, the first conductor, the first insulating layer and the second insulating layer;

(d) forming the second wiring so as to overlap the first insulating layer;

(e) forming the second- and the third-conductor on the second insulating layer; and (f) forming the electrode on the remaining part of the insulating substrate.

According to the invention, the metallic circuit board comprises:

a wiring formed on an insulating substrate and patterned with a predetermined figure;

an island conductor formed on the insulating substrate leaving a space from the wiring; and an anodized insulating layer enveloping the entire surface of the wiring, the entire surface of the island conductor and an insulating substrate surface between the wiring and the island conductor, and it is manufactured in a method comprising the following steps.

First conducting layers are formed in respective regions where the wiring and the island conductor are to be formed. A second conducting layer is formed extending from the first conducting layer formed in a region where the wiring is to be formed to the first conducting layer formed in a region where the island conductor is to be formed. The second conducting layer is oxidized in an anodization method by using the second conducting layer as an anode.

For example, when the second conducting layer is formed so as to envelop only part of the respective surfaces of the two first conducting layers, and oxidized in the manner mentioned above, the two first conducting layers also serve as an anode and are anodized because the first conducting layers are electrically continued to the second conducting layer.

The oxidation progresses from the surfaces of the first and second conducting layers in their thickness direction. When the anodization is continued until the second conducting layer is completely oxidized, the second conducting layer is converted into an insulating layer. Consequently, not only the second conducting layer, but also the first conducting layer for an island conductor is not an anode any longer. Accordingly, the oxidation of the first conducting layer for an island conductor stops at the point of time when the second conducting layer has been completely oxidized.

Thereby, the oxidized part of the first conducting layers and the second conducting layer become the anodized insulating layer. The not-oxidized part of one of the first conducting layers becomes the wiring and the not-oxidized part of the other of the first conducting layers becomes the island conductor.

In anodizing the layers in the case where, in order to make the second conducting layer an anode, a flow of electricity is applied to the first conducting layer for the wiring, the oxidation of the first conducting layer for the island conductor stops when the second conducting layer has been completely oxidized. Further applying a flow of electricity thereto renders it possible to further oxidize only the first conducting layer for the wiring.

In such manufacturing method, the thickness of the second conducting layer is selected to be smaller than those of the first conducting layers, in order to form respective not-oxidized parts of the first conducting layers, namely, in order to form a wiring and an island conductor.

In the case where the second conducting layer is formed to envelop the respective entire surfaces of the two first conducting layers and the second conducting layer is oxidized in the above-mentioned manner, the oxidation stops at the point of time when the second conducting layer formed between the two first conducting layers has been completely oxidized.

Thereby, the anodized second conducting layer becomes the anodized insulating layer and one of the first conducting layers and the other thereof become the wiring and the island conductor, respectively.

Further, the metallic circuit board of the invention is manufactured as follows. A first conducting layer is formed so as to extend from a region where the wiring is to be formed on the insulating substrate to a region where the island conductor is to be formed on the insulating substrate. Second conducting layers are formed in respective regions where the wiring and the island conductor are to be formed. The thicknesses of the second conducting layers are selected to be thicker than that of the first conducting layer. The first and second conducting layers are oxidized in the anodization method by using the first and second conducting layers as an anode.

The oxidation starts from the surface of the first and second conducting layers and progresses in the direction of their conducting layers thickness. The exposed portion of the first conducting layer is converted into an insulating layer if the anodization thereof is continued until the exposed portion of the first conducting layer has been completely oxidized. Additionally, not only the first conducting layer, but also the second conducting layer for an island conductor is not an anode any longer due to the conversion of the exposed portion of the first conducting layer into an insulating layer. Therefore, the oxidation of the second conducting layer for an island conductor stops at the point of time when the exposed portion of the first conducting layer has been completely oxidized.

Thereby, the oxidized parts of the first and second conducting layers become the anodized insulation layer. The not-oxidized part of one of the second conducting layers and the not-oxidized part of the first conducting layer on the side of the one of the second conducting layers become the wiring and the not-oxidized part of the other of the second conducting layers and the not-oxidized part of the first conducting layers on the side of the other of the second conducting layers become the island conductor.

In anodizing the layers, in the case where a flow of electricity is applied to the second conducting layer for the wiring, the oxidation of the second conducting layer for the island conductor stops when the first conducting layer has been completely oxidized. Further applying a flow of electricity thereto renders it possible to further oxidize only the second conducting layer for the wiring.

The wiring and island conductor of the metallic circuit board manufactured in such manner are electrically isolated with each other, and they can be completely enveloped by an insulating layer.

According to the invention, the thin film diode array comprises;

an insulating substrate;

a first wiring formed in a predetermined pattern on the insulating substrate;

a first anodized insulating layer enveloping the first wiring;

a second anodized wiring formed so as to overlap the first anodized insulating layer;

an electrode to which signals from the second wiring are applied; and a diode element for providing and interrupting the signals to be applied to the electrode, the diode element comprising;

a first conductor formed on the insulating substrate leaving a predetermined space from the first wiring;

a second anodized insulating layer enveloping the first conductor, a second conductor formed on the second anodized insulating layer and connected to the second wiring; and a third conductor formed on the second anodized insulating layer with keeping electrical isolation from the second conductor and connected to the electrode, and it is manufactured as follows.

First conducting layers are formed in respective regions where the first wiring and the first conductor are to be formed on the insulating substrate. A second conducting layer is formed so as to extend from the first conducting layer formed in a region where the first wiring is to be formed to the first conducting layer formed in a region the first conductor is to be formed. The second conducting layer is anodized in the above-mentioned manner. Thereby, the first wiring, the first conductor, the first insulating layer and the second insulating layer are formed. The first and second anodized insulating layers are formed at the same time to be contacted with each other. The second wiring is formed so as to overlap the first insulating layer. Additionally, the second- and the third-conductor are formed on the second insulating layer. Still further, the electrode is formed on the remaining part of the insulating substrate.

Further, the thin film diode array is manufactured as follows. A first conducting layer is formed so as to extend from a region where the first wiring is to be formed on the insulating substrate to a region where the first conductor is to be formed on the insulating substrate. Second conducting layers are formed so as to be thicker than that of the first insulating layer in the respective regions where the first wiring and the first conductor are to be formed. The first and second conducting layers are oxidized in the above-mentioned manner. Thereby, the first wiring, the first conductor, the first insulating layer, and the second insulating layer are formed. Thereafter, the second wiring, the second- and the third-conductor, and the electrode are formed in the same method as the alone.

The thin film diode array manufactured in such manner is of a so-called back-to-back type having two metal-insulator-metal constitutions. According to the invention, the first wiring and the first conductor composing a diode element are formed to be completely insulated from each other and the first wiring and the first conductor are completely enveloped by an insulating layer. Consequently, the diode element is excellent in symmetry of voltage-ampere characteristic.

Further according to the invention, the thickness of the anodized insulating layer which envelopes the wiring and the island conductor on the metallic circuit board, or the first wiring and the first conductor in the thin film diode array can be controlled by the thickness of the conducting layer which is used as an anode in anodizing. Accordingly, the accuracy of the insulating layer thickness and patterning is excellent in comparison with the prior art of forming an insulating layer in a dry-etching method or the like. Furthermore, such metallic circuit board and thin film diode can be manufactured with relative ease.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENT

Figure 1:
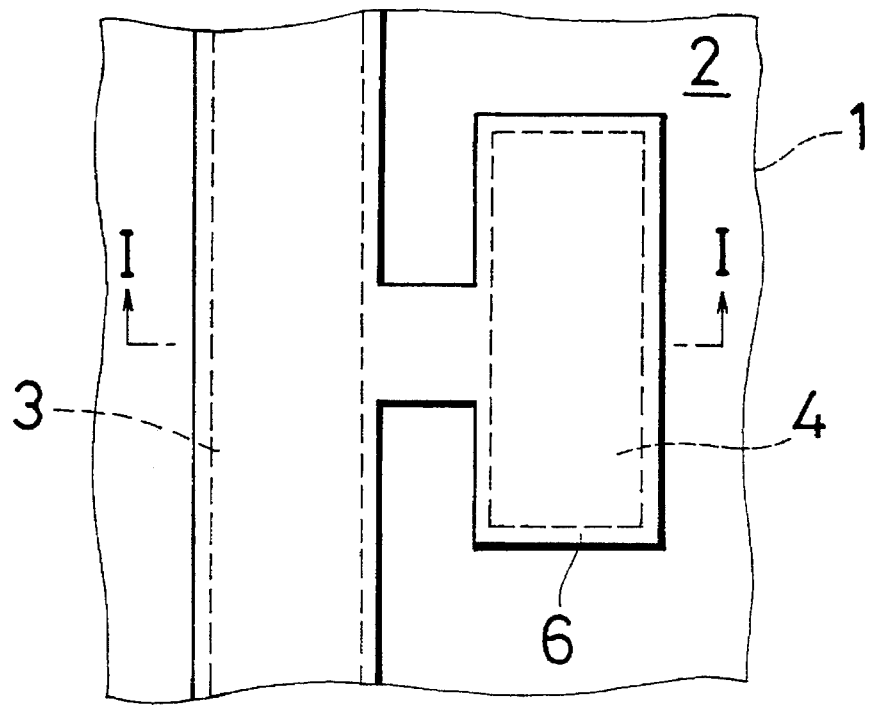
FIG. 1 is a partial plan view of an embodiment of a metallic circuit board of the invention.

Now referring to the drawings, preferred embodiments of the invention are described below.

EMBODIMENT 1

Figure 2:
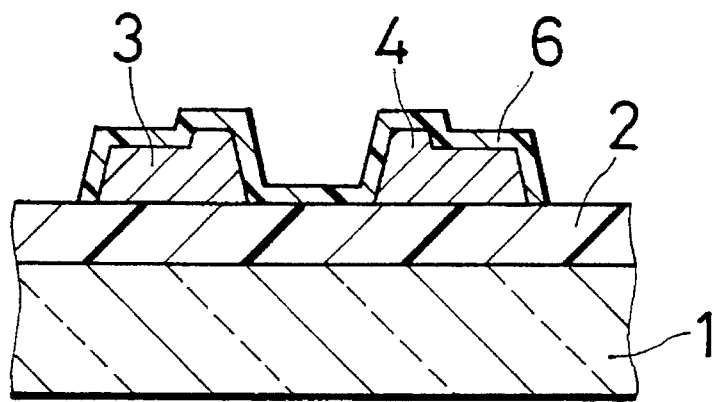
FIG. 2 is a sectional view taken along line I—I of FIG. 1.

FIGS. 1–5 are views showing an embodiment of a metallic circuit board and a method for manufacturing the same according to the invention. FIG. 1 is a partial plan view of an embodiment of a metallic circuit board of the invention and FIG. 2 is a sectional view taken along line I—I of FIG. 1.

Referring to the drawings, reference numeral 1 indicates a glass substrate as an insulating substrate, reference numeral 2 indicates a substrate protective coat which is an insulating film for protecting the glass substrate 1 by coating the surface of the glass substrate 1 and numerical 3 and 4 indicate a wiring and an island conductor, respectively, which are made of Ta, Al, Cr, etc. Reference numeral 6 indicates an anodized insulating layer formed in the below-mentioned manner. The wiring 3 is formed on the substrate protective coat 2 by the use of a predetermined pattern and the island conductor 4 is formed on the substrate protective coat 2 leaving a predetermined space from the wiring 3. The entire surface of the wiring 3, the entire surface of the island conductor 4, and the surface of the substrate protective coat 2 between the wiring 3 and the island conductor 4 are coated with the anodized insulating layer 6.

Figure 3A:
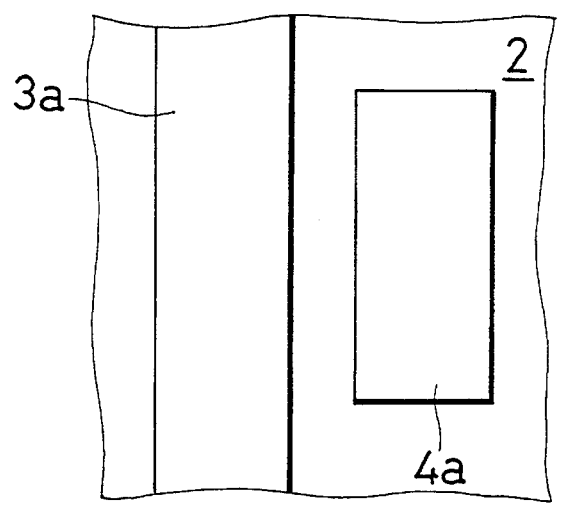
FIGS. 3A–3C are partial plan views illustrating the steps of a manufacturing method of an embodiment of a metallic circuit board of the invention.
Figure 3B:
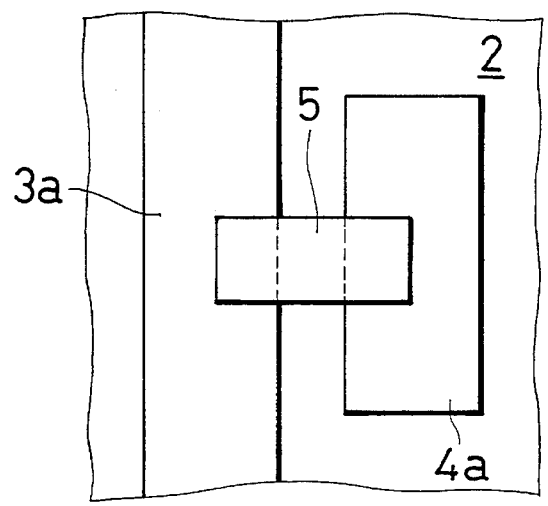
Figure 3C:
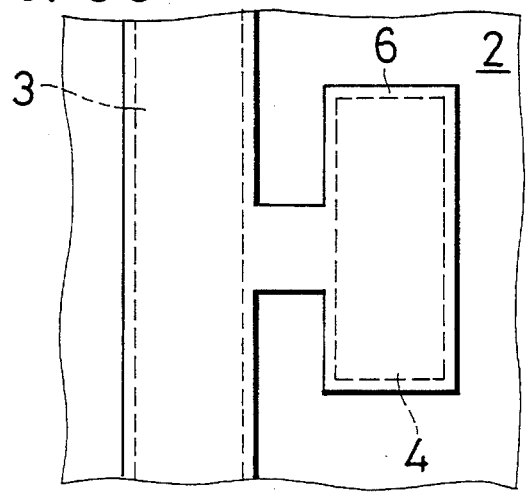

Referring to FIGS. 3A–3C, 4, a method for manufacturing a metallic circuit board with the above-mentioned constitution will be described. FIGS. 3A–3C are partial plan views illustrating the steps of the manufacturing method of a metallic circuit board and FIGS. 4A–4C are partial sectional views illustrating the same.

Figure 4A:
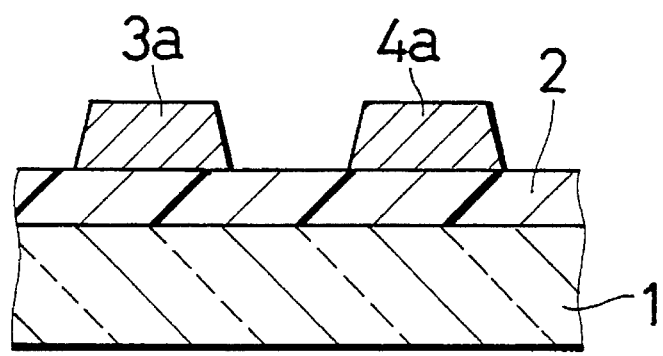
FIGS. 4A–4C are partial sectional views illustrating the steps of a manufacturing method of an embodiment of a metallic circuit board of the invention.
Figure 4B:
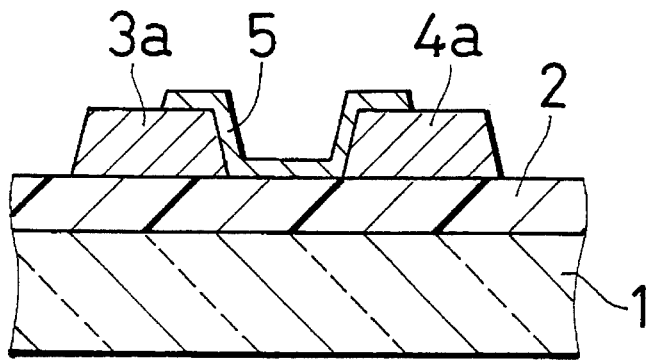

First, a $Ta_2O_5$ film having a thickness of 5000 Å is formed as a substrate protective coat 2 on the glass substrate 1. Besides, a Ta layer to become a first conducting layer is formed thereon by sputtering and the like so as to have a thickness of 3000 Å and thereafter patterning and wet etching by using a mixture of hydrofluoric acid and nitric acid are conducted to form first conducting layers 3a, 4a over a region where the wiring 3 and the island conductor 4 are finally formed as shown in FIGS. 3A, 4A.

Then, a layer of Al to become a second conducting layer is further formed on the substrate protective coat 2 by adhering so as to have a thickness of 200 Å and thereafter patterning and etching by using phosphoric acid or a mixture thereof are conducted to form a second conducting layer 5 for the purpose of obtaining electrical conductivity between the first conductive layers 3a, 4a. The second conducting layer 5 may be formed of metals capable of being anodized such as Ta and Nb besides Al, and is formed to connect the first conducting layers 3a, 4a therewith.

Figure 5A:
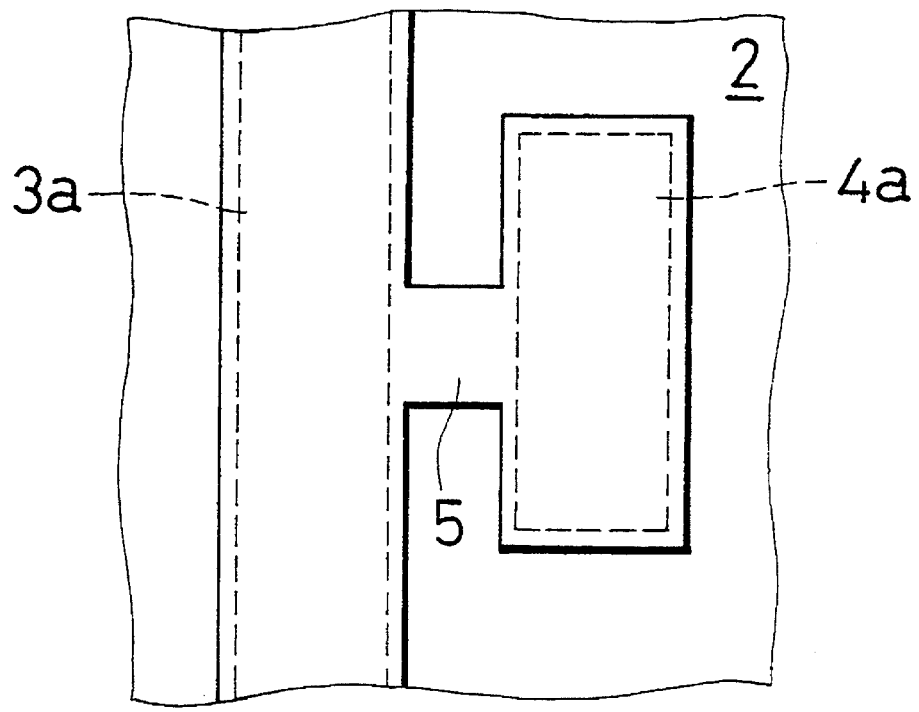
FIG. 5A is a partial plan view illustrating a manufacturing method of other embodiment of a metallic circuit board of the invention.
Figure 5B:
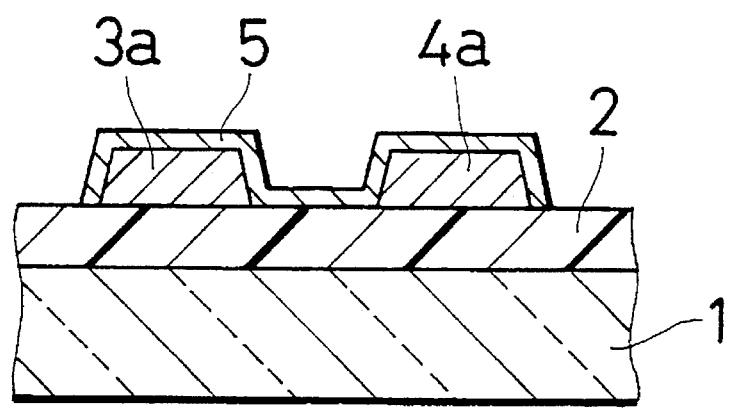
FIG. 5B is a sectional view thereof.

As shown in FIGS. 5A, 5B, the second conducting layer 5 may be formed so that the first conducting layers 3a, 4a are entirely covered therewith. That is employed in the case where the first conducting layers 3a, 4a are not formed of metals capable of being anodized or a good quality of insulating layer can not be formed because of unattainability of stable anodization. The metals capable of being anodized include Ti, Fe, and Cu in addition to Al, Ta, and Nb described above, and a good quality of insulating layer can be obtained in Ta and Al. In particular, in the case of a diode element, Ta is employed.

Figure 4C:
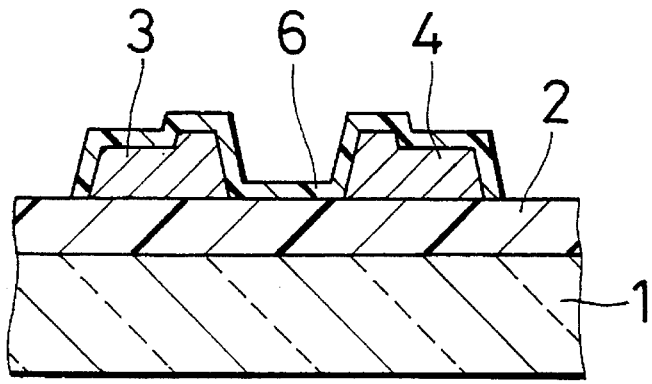

Next, the first and second conducting layers 3a, 4a, 5 are anodized in the below-mentioned until the second conducting layer 5 is completely anodized. Thereby, an anodized insulating layer 6 is formed, which comprises the second conducting layer 5 completely anodized and parts of the first conducting layers 3a, 4a anodized by a predetermined thickness from their surfaces. Additionally, as shown in FIGS. 3C, 4C, remaining portions of the first conducting layers 3a, 4a form the wiring 3 and island conductor 4, respectively, which are consequently insulated.

In this case, the oxidation of the first conducting layer 4a stops at the same time when the second conducting layer 5 has been completely anodized and electrically insulated from the first conducting layer 3a. Namely, the thickness of the anodized insulating layer 6 enveloping the island conductor 4 is controlled by the thickness of the second conducting layer 5.

The oxidation of the first conducting layer 3a is carried out by controlling the voltage and time of the anodization until the oxidation reaches up to the required thickness.

The anodization is carried out, for example, as follows. A 1% ammonium tartrate solution is prepared. An electrode made of platinum and the glass substrate 1 wherein the first and second conducting layers 3a, 4a, 5 are formed are dipped. A predetermined voltage is applied using the electrode of platinum as a cathode and the first conducting layer 3a in the region where the wiring 3 is to be formed as an anode. Thereby, hydrogen is generated from the cathode and an oxidized film is formed on the surface of the anode because of the oxidation thereof. The applied voltage is first increased at a fixed rate as a constant current state, and when a predetermined voltage has been reached, a constant voltage state is retained. In the constant voltage state, the current value decreases little by little. It is considered that the anodization stops when the current value has become fairly small. The thickness of a anodized film depends on the set value of the voltage.

As described above, the second conducting layer 5 also becomes an anode by using the first conducting layer 3a in the region where the wiring 3 is to be formed as an anode and also the first conducting layer 4a, which is electrically continued to the first conducting layer 3a through the second conducting layer 5, in a region where the island conductor 4 is to be formed, becomes an anode and the surfaces of the conducting layers are anodized.

Figure 6A:
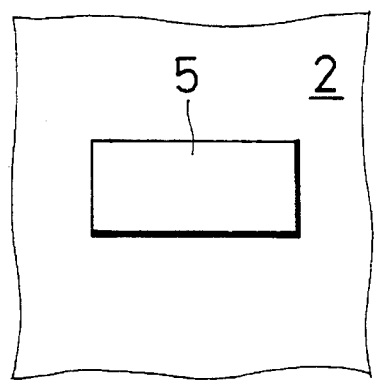
FIGS. 6A–6C are partial plan views illustrating the steps of a manufacturing method of still other embodiment of a metallic circuit board of the invention.
Figure 6B:
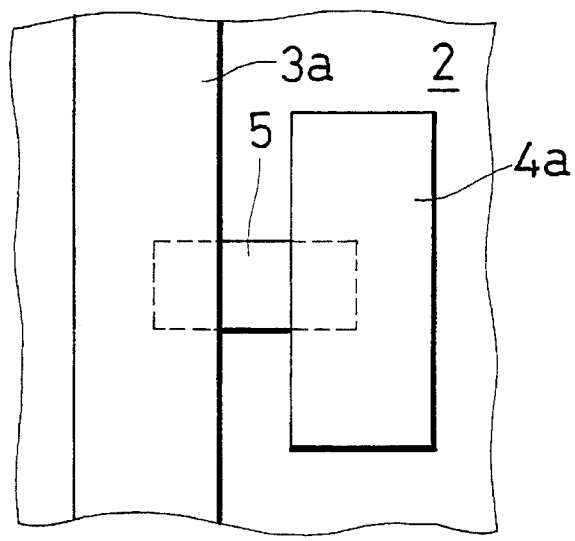
Figure 6C:
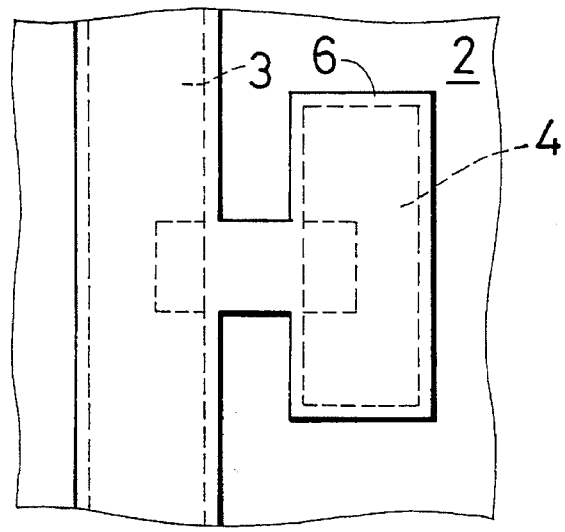
Figure 7A:
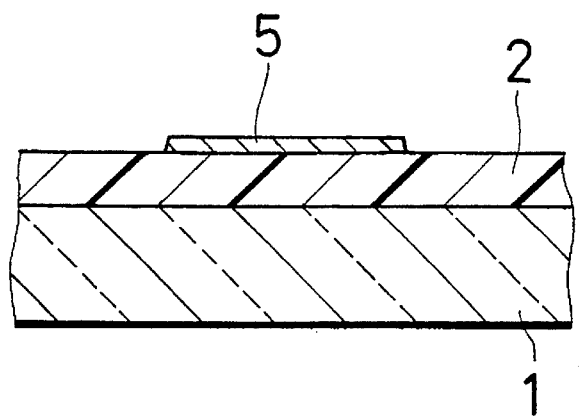
FIGS. 7A–7C are partial sectional views illustrating the steps of a manufacturing method of still other embodiment of a metallic circuit board of the invention.
Figure 7B:
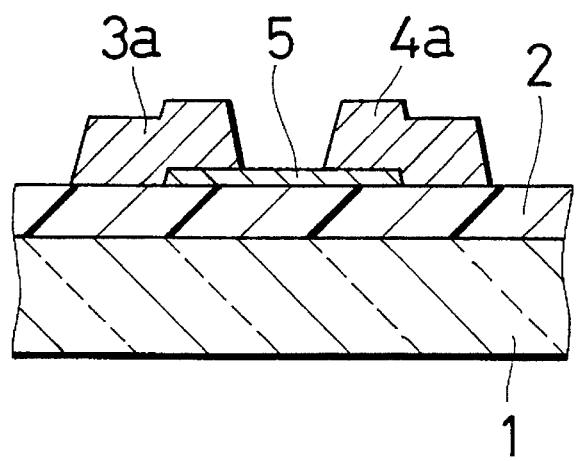
Figure 7C:
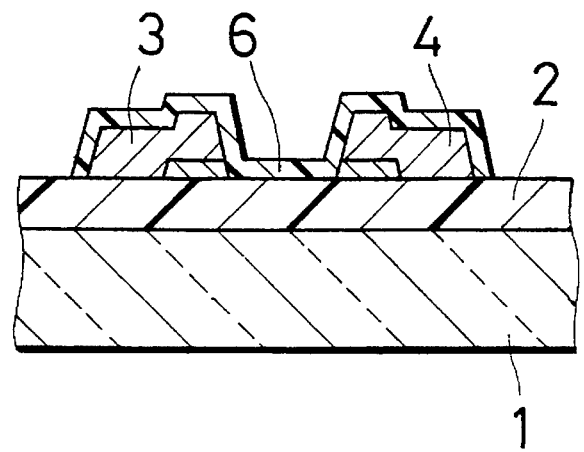

Referring to FIGS. 6, 7, a method for manufacturing another metallic circuit board having the same constitution as that of the above-mentioned will be described. FIGS. 6A–6C are partial plan views illustrating the steps of a manufacturing method of another metallic circuit board and FIGS. 7A–7C are partial sectional views illustrating the same. The embodiment is characterized in that the second conducting layer 5 mentioned above is formed prior forming the first conducting layers 3a, 4a mentioned above.

First, a $Ta_2O_5$ film having a thickness of 5000 Å is formed as a substrate protective coat 2 on the glass substrate 1. Besides, an Al layer to become a second conducting layer 5 is formed thereon by sputtering and the like so as to have a thickness of 200 Å and thereafter patterning and wet etching by using (a mixture of hydrofluoric acid and nitric acid are conducted to form the second conducting layer 5 so as to extend over respective regions where the wiring 3 and the island conductor 4 are to be finally formed as shown in FIGS. 6A, 7A.

Then, a layer of Ta to become a first conducting layer is further formed thereon by sputtering and the like so as to have a thickness of 3000 Å and thereafter patterning and etching by using phosphoric acid or a mixture thereof are conducted to form the first conducting layers 3a, 4a to finally become the wiring 3 and the island conductor 4 in respective predetermined regions for that purpose. Thereby, the first conducting layers 3a, 4a are electrically conducted via the second conducting layer 5.

Next, the first and second conducting layers 3a, 4a, 5 are anodized until part of the second conducting layer 5 whose surface is exposed is completely anodized in the thickness direction. Thereby, an anodized insulating layer 6 is formed, which comprises the anodized second conducting layer 5 and parts of the first conducting layers 3a, 4a anodized by a predetermined thickness from the surfaces. Additionally, as shown in FIGS. 6C, 7C, the not-anodized part of the second conducting layer 5 on the side of the first conducting layer 3a and the not-anodized part of the first conducting layer 3a become the wiring 3 and the not-anodized part of the second conducting layer 5 on the side of the first conducting layer 4a and the not-anodized part of the first conducting layer 4a become the island conductor 4. The wiring 3 and the island conductor 4 are electrically isolated from each other.

In this case, the oxidation of the first conducting layer 4a stops at the same time when part of the second conducting layer 5 whose surface is exposed has been completely anodized in the thickness direction and electrically insulated from the first conducting layer 3a. Namely, the thickness of the anodized insulating layer 6 enveloping the island conductor 4 is controlled by the thickness of the second conducting layer 5.

The oxidation of the first conducting layer 3a is carried out by controlling the voltage and time of the anodization until the oxidation reaches up to the required thickness.

In the case where the metallic circuit board formed in the above-mentioned manner is used in the below-mentioned TFD array, since the most excellent properties of the anodized insulating layer 6 enveloping the island conductor can be obtained in that made of $Ta_2O_5$, Ta is preferably employed as a material of the first and second conducting layers 3a, 4a, 5. Further, the thickness of the second conducting layer 5 is preferably thinner than those of the first conducting layers 3a, 4a, and thereby, respective parts of the first conducting layers 3a, 4a remain not-oxidized, even when the second conducting layer 5 on the part thereof whose surface is exposed is completely oxidized.

The embodiment of the invention is specifically described in the above, and the metallic circuit board according to the invention is not limited to the above embodiment. Additionally, also the manufacturing method thereof is not limited thereto.

EMBODIMENT 2

The metallic circuit board prepared in accordance with the manufacturing method of the embodiment 1 is used in order to prepare a TFD array. In a TFD array of this embodiment, the wiring 3 and the island conductor 4 are described as "the first wiring 3" and "the first conductor 4", respectively.

FIGS. 8–13 are views showing an example of a TFD array and a manufacturing method of the invention. Additionally, in this embodiment, a picture element electrode 9 was formed as an electrode which is given signals from the wiring on the assumption that the TFD array is applied to a display device. The electrode is not limited to a picture element electrode 9 and a desired electrode can be selected in correspondence with the application of the TFD array.

Figure 8:
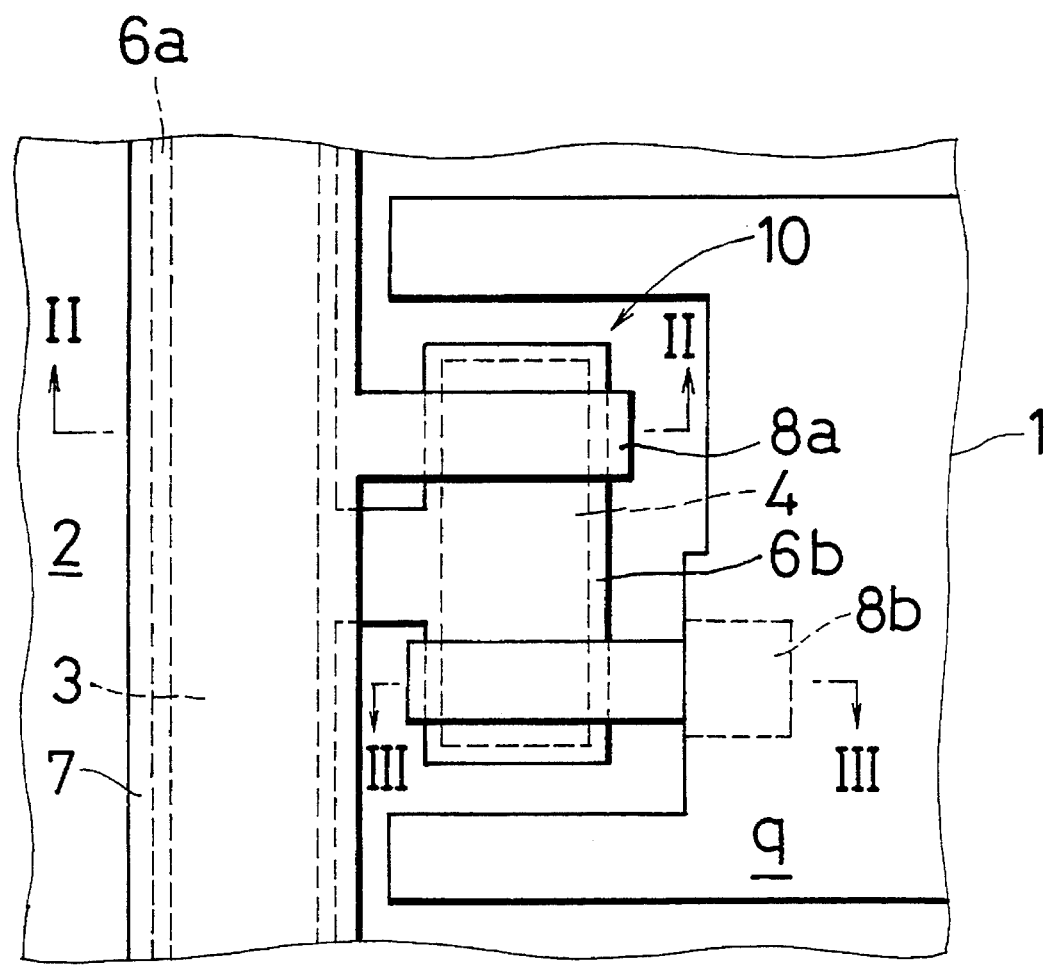
FIG. 8 is a partial plan view of an embodiment of a thin film diode array of the invention.
Figure 9:
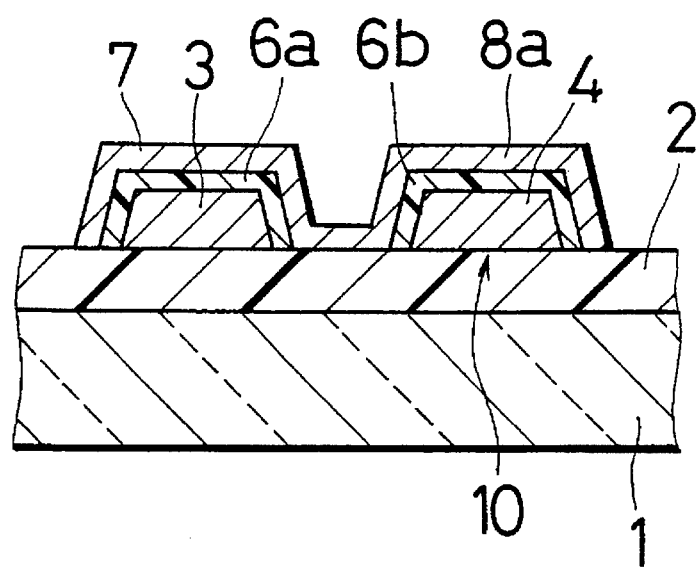
FIG. 9 is a sectional view taken along line II—II of FIG. 8.
Figure 10:
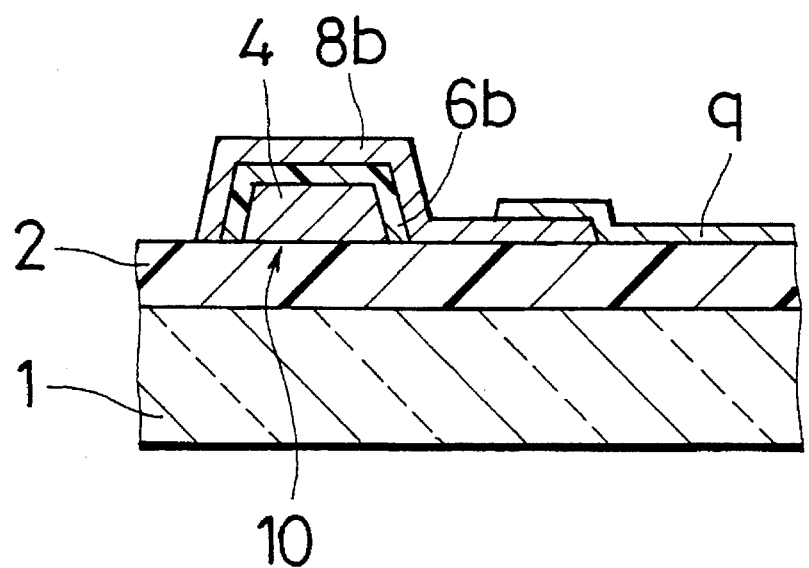
FIG. 10 is a sectional view taken along line III—III of FIG. 8.

FIG. 8 is a partial plan view of an embodiment of a thin film diode array of the invention, and FIG. 9 is a sectional view taken along line III—III of FIG. 8. FIG. 10 is a sectional view taken along line III—III of FIG. 8.

Referring to the drawings, reference numeral 10 indicates a TFD element, reference numeral 1 a glass substrate as an insulating substrate, and reference numeral 2 a substrate protective insulating film which envelopes the surface of the glass substrate 1 and protects the glass substrate 1. Reference numerals 3, 4 indicate the first wiring and the first conductor made of Ta, Al, Cr, etc., respectively, reference numeral 6a, 6b indicate the first and the second anodized insulating layer, respectively. Reference numerals 7, 8a, 8b indicate the second wiring, the second- and the third-conductor, respectively, which are made of, for example, Al, Ti, Mo, and ITO. Reference numeral 9 indicates a picture element electrode. The TFD element 10 comprises the first conductor 4, the second anodized insulating layer 6b, and the second conductor 8a and the third conductor 8b.

Referring to FIGS. 11–13, a method for manufacturing a TFD array with the above-mentioned constitution will be described. The TFD array is prepared in succession to the preparation of the metallic circuit board of the first embodiment (FIGS. 1, 2, 3c, 4c, 6c, 7c).

Figure 11A:
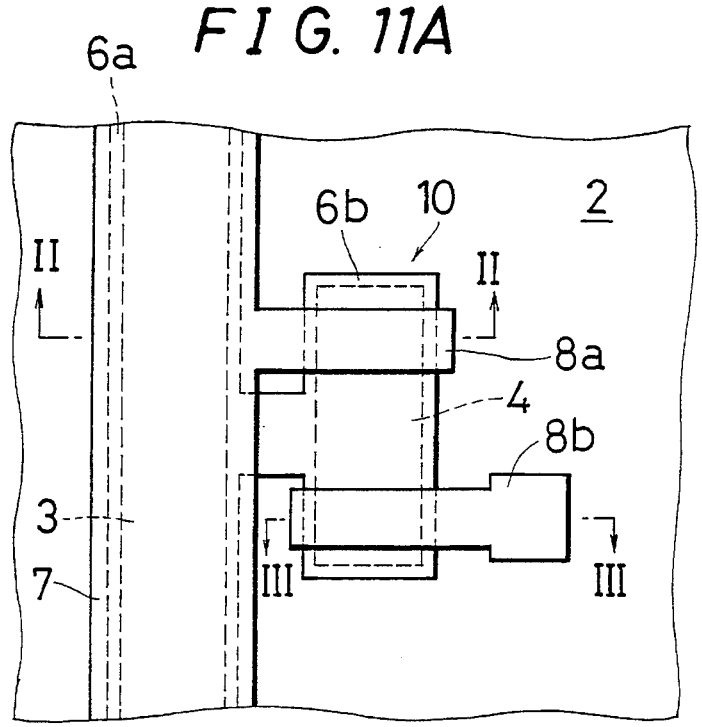
FIGS. 11A, 11B are partial plan views illustrating the steps of a manufacturing method of an embodiment of a thin film diode array of the invention.
Figure 11B:
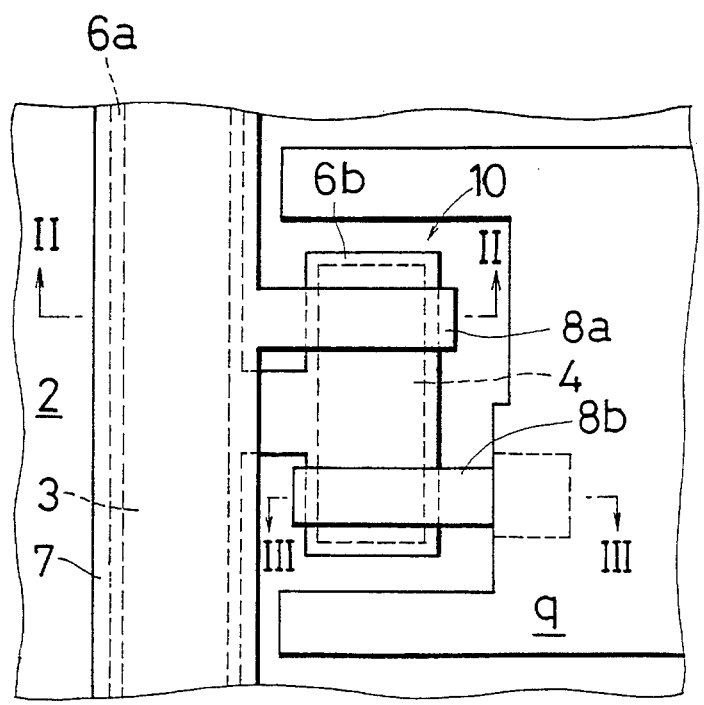
Figure 12A:
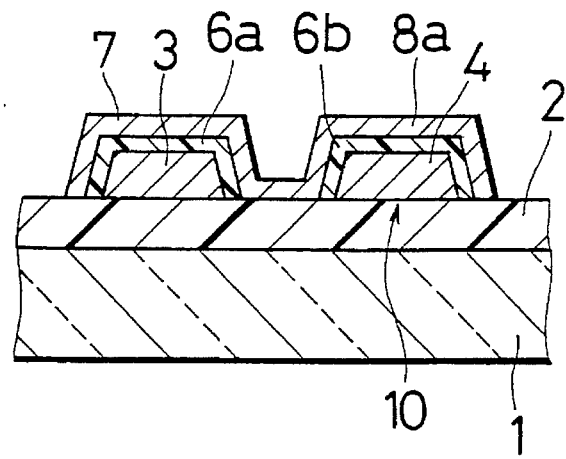
FIGS. 12A, 12B are sectional views taken along line II—II of FIGS. 11A, 11B, respectively.
Figure 12B:
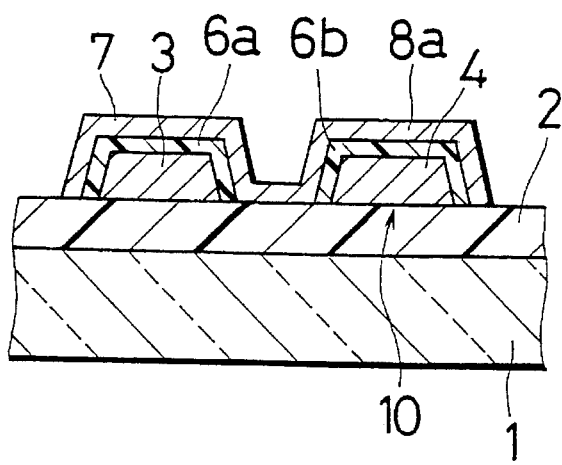
Figure 13A:
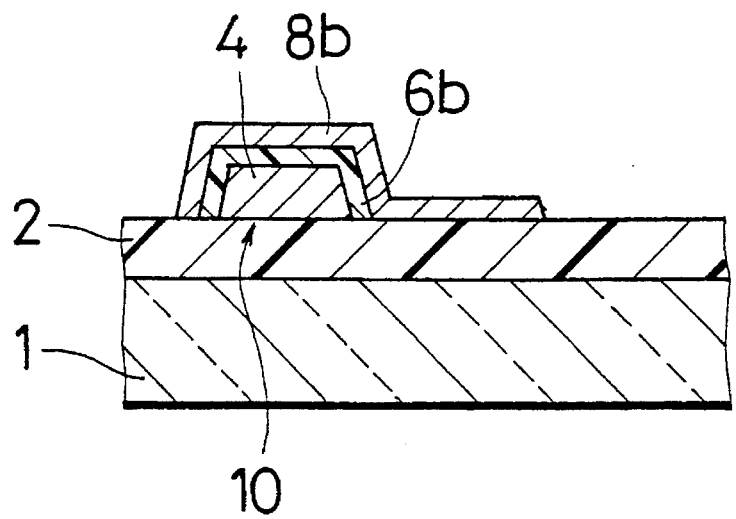
FIGS. 13A, 13B are sectional views taken along line III—III of FIGS. 11A, 11B.
Figure 13B:
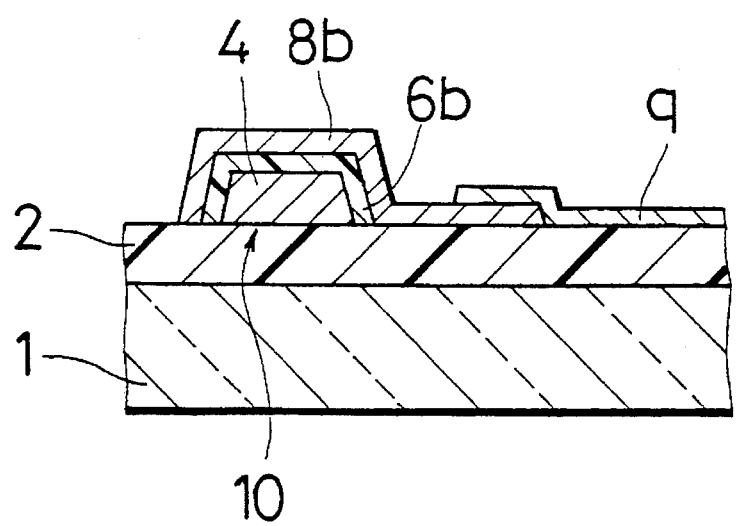

FIGS. 11A, 11B are partial plan views illustrating the steps of a manufacturing method of an embodiment of a thin film diode array of the invention. FIGS. 12A, 12B are sectional views taken along line II—II of FIGS. 11A, 11B, respectively. FIGS. 13A, 13B are sectional views taken along line III—III of FIGS. 11A, 11B, respectively.

First, an Al film having a thickness of 2000 Å is formed by spattering and the like on the metallic circuit board made according to the method of the embodiment 1, and thereafter patterning and etching by the use of phosphoric acid or a mixture thereof are conducted to form the second wiring 7 and the second- and the third-conductor 8a, 8b, as shown in FIGS. 11A, 12A, 13A. The second conductor 8a is connected to the second wiring 7. The second wiring 7 is provided in parallel with the first wiring 3. Thereby, a TFD element 10 is formed, which comprises the first conductor 4, the second anodized insulating layer 6b and the second- and the third-conductor 8a, 8b. The first and second anodized insulating layers 6a, 6b are simultaneously formed by the above-mentioned anodization method and they are connected with each other.

The TFD element 10 made in such manner has a back-to-back constitution and the first conductor 4 is formed so that the insulation between the first conductor 4 and the first wiring 3 is completely preserved and the first conductor 4 and the first wiring 3 are completely enveloped by the insulating layer. Accordingly, that makes it possible to form a TFD element wherein the voltage-ampere characteristic is symmetry on a positive-voltage- and a negative-voltage-side.

In this case, if the second wiring 7 and the first wiring 3 for the purpose of forming the first and second anodized insulating layers 6a, 6b are connected with each other, for example, at the terminal thereof, not only the decrease of wiring resistance can be attained but also the strength of the structure can be enhanced against disconnection of wiring.

For the purpose of the connection of the first and second wirings 3, 7, the terminal portion of the first wiring 3 is enveloped, for example, by a resist film on anodizing. Thereby, the terminal portion is prevented from being oxidized. After removing the resist film, the naked terminal portion of the first wiring 3 and the second wiring 7 are connected by contacting with each other.

Successively, an ITO film having a thickness of 1000 Å are formed and thereafter patterning and etching by the use of hydrobromic acid are carried out to form the picture element electrode 9 as shown in FIGS. 11B, 12B, 13B. The picture element electrode 9 is connected to the third conductor 8b.

In certain cases, an auxiliary capacitance element 11 is formed for each picture element in order to retain the electric charge of liquid crystal. Even in such cases, the TFD array can be prepared without increasing the number of the manufacturing steps.

Referring to FIGS. 14A, 14B, 15A, 15B, the manufacturing method of a TFD array in which an auxiliary capacitance element 11 is formed will be described. The auxiliary capacitance element 11 is provided by utilizing the first wiring 3 for the purpose of forming the first and second anodized insulating layers 6a, 6b.

Figure 14A:
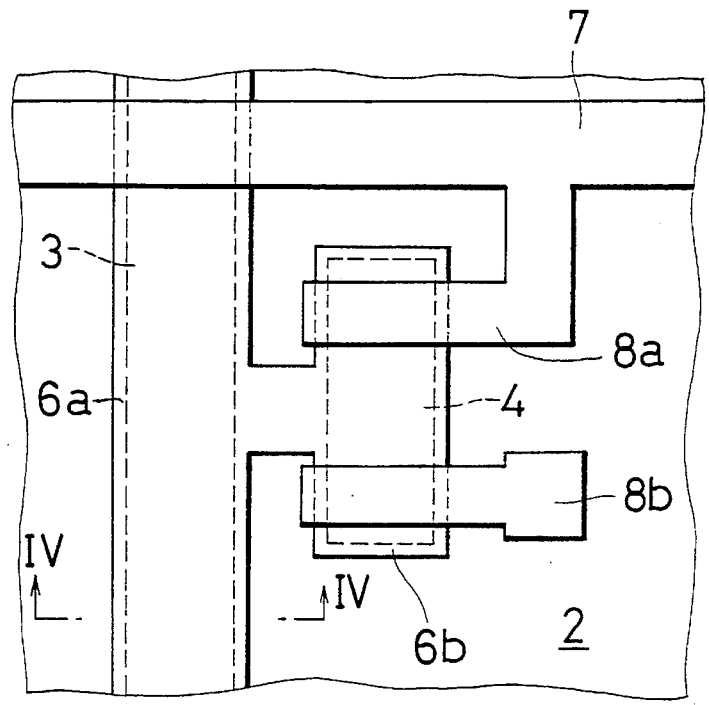
FIGS. 14A, 14B are partial plan views illustrating the steps of a manufacturing method of other embodiment of a thin film diode array of the invention.
Figure 14B:
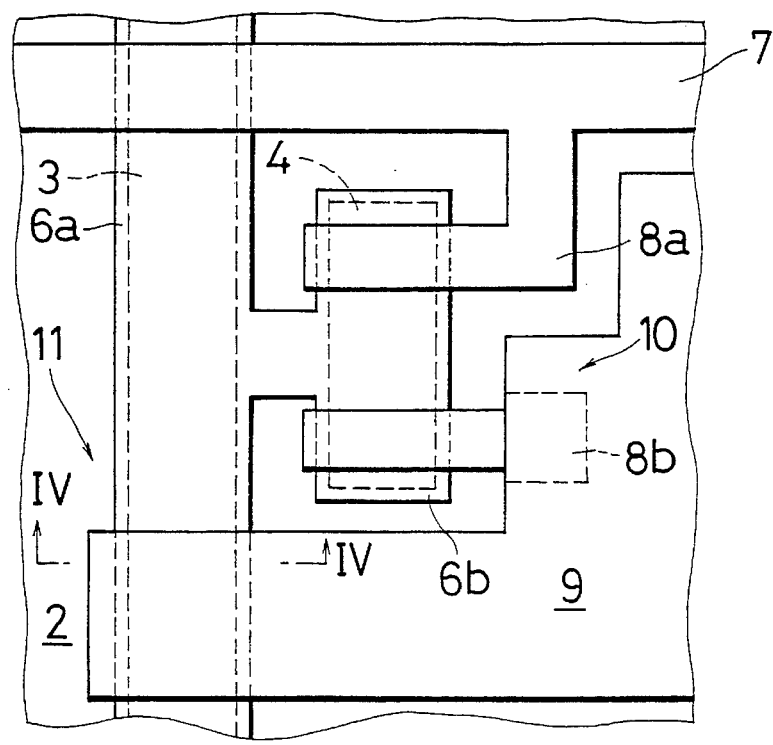
Figure 15A:
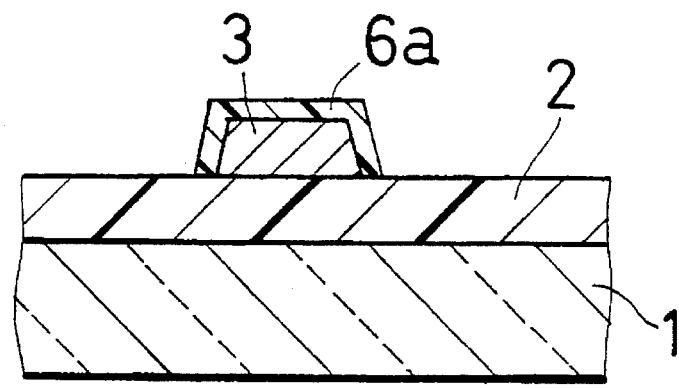
FIGS. 15A, 15B are sectional views taken along IV—IV of FIGS. 14A, 14B, respectively.
Figure 15B:
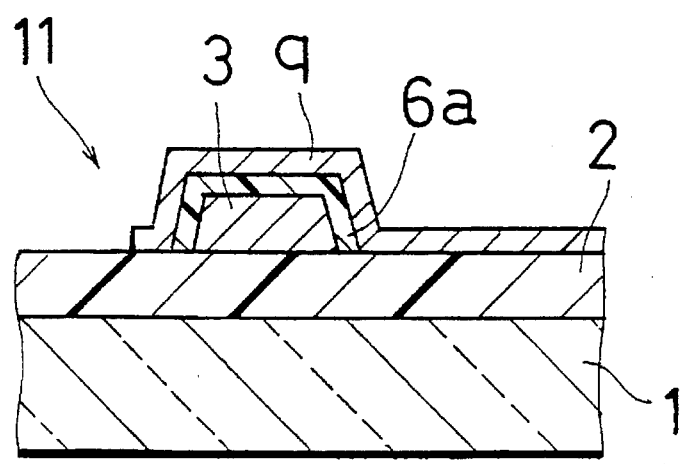
Figure 16:
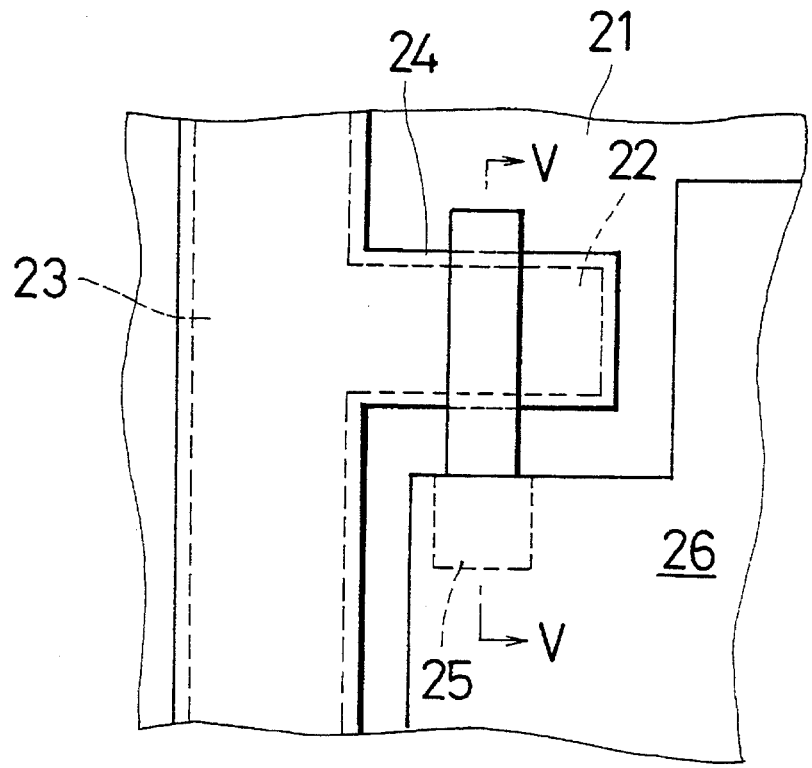
FIG. 16 is a partial plan view of a conventional thin film diode array.
Figure 17:
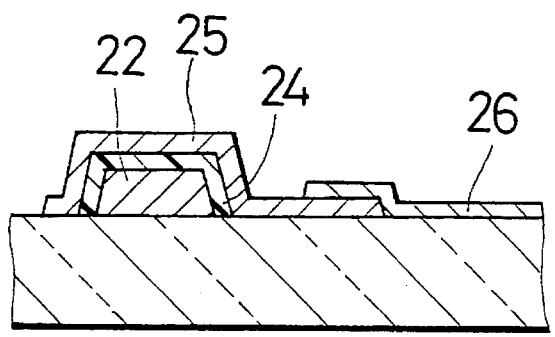
FIG. 17 is a sectional view taken along line V—V of FIG. 16.

FIGS. 14A, 14B are partial plan views illustrating the steps of a manufacturing method of another embodiment of a TFD array according to the invention. FIGS. 15A, 15B are sectional views taken along line IV—IV of FIGS. 14A, 14B, respectively.

First, an Al film having a thickness of 2000 Å is formed by sputtering and the like on the metallic circuit board prepared according to the method of the embodiment, and thereafter patterning and etching by the use of phosphoric acid or a mixture thereof are conducted to form the second wiring 7 and the second and third conductors 8a, 8b, as shown in FIG. 14A. The second wiring 7 is provided in perpendicular with the first wiring 3 in a plane parallel with the surface of the glass substrate 1. At that time, the second wiring 7, the second and third conductors 8a, 8b have not been formed in a region where the auxiliary capacitance element 11 is to be formed. The sectional view is as shown in FIG. 15A.

The TFD element 10 made in such manner, has a back-to-back constitution, which is the same as that of TFD element without the auxiliary capacitance element 11. Accordingly, a TFD element which has a symmetric voltage-ampere characteristic on a positive-voltage- and a negative-voltage-side can be formed.

In the TFD array, the second wiring 7 and the first wiring 3 are used as a picture signal wiring and a capacitance wiring, respectively.

Then, an ITO film having a thickness of 1000 Å is formed by spattering and the like, and thereafter, patterning and etching by the use of hydrobronic acid are conducted to form the picture element electrode 9 as shown in FIGS. 14B, 15B.

The picture element electrode 9 is formed so as to overlap the first wiring 3, and a portion where the picture element electrode 9 and the first wiring 3 overlap each other becomes the auxiliary capacitance element 11.

In the embodiment, the second wiring 7, the second and third conductors 8a, 8b, and the picture element electrode 9 can be simultaneously patterned. Consequently, the number of the manufacturing steps can be reduced, which leads economical manufacturing.

The anodized insulating layer of the invention is formed only on the surface of a conductor (e.g. made of a metal) by anodization. On the other hand, in the case where the insulating layer is formed by laminating, the insulating layer is formed not only on the surface of the conductor, but also on the surface of the substrate the conductor is formed. Therefore, it is possible to distinguish the insulating layer formed by anodization from that formed by laminating.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of manufacturing a metallic circuit board wherein at least a wiring of a predetermined pattern, an island conductor spaced from the wiring, a first insulating layer covering the entire surface of the wiring, and a second insulating layer, covering the entire surface of the island conductor, are formed on one surface of an insulating substrate, the method comprising the steps of:

(a) forming one first conducting layer on a portion of one surface of the insulating substrate, namely the portion where the first insulating layer is to be formed, and another first conducting layer on a portion of the one surface of the insulating substrate, namely the portion where the second insulating layer is to be formed, (b) forming a second conducting layer on the one surface of the insulating substrate so that at least a part of the second conducting layer contacts said respective first conducting layers, and (c) anodizing the first and second conducting layers, by using the second conducting layers as an anode, until the second conducting layer is completely oxidized to turn the non-oxidized portion of the one first conducting layer into the wiring, the oxidized portion of the one first conducting layer and the oxidized portion of the second conducting layer covering the non-oxidized portion of the one first conducting layer into the first insulating layer covering the surface of the wiring, the non-oxidized portion of the other first conducting layer into the island conductor, and the oxidized portion of the other first conducting layer and the oxidized portion of the second conducting layer covering the non-oxidized portion of the other first conducting layer into the second insulating layer covering the surface of the island conductor.

2. The method of claim 1, wherein the second conducting layer is so formed as to be superimposed on the entire surfaces of the respective first conducting layers.

3. The method of claim 1, wherein the second conducting layer is so formed as to be superimposed on a part of the surface of each first conducting layer and to be thinner in thickness than the first conducting layers.

4. A method of manufacturing a metallic circuit board wherein at least a wiring of a predetermined pattern, an island conductor spaced from the wiring, a first insulating layer covering the entire surface of the wiring, and a second insulating layer, covering the entire surface of the island conductor, are formed on one surface of an insulating substrate, the method comprising the steps of:

(a) forming a first conducting layer on the one surface of the insulating substrate so that a part of the first conducting layer is superimposed on a portion of the one surface of the insulating substrate, namely the portion where the first insulating layer is to be formed, and on a portion of the one surface of the insulating substrate, namely the portion where the second insulating layer is to be formed, (b) forming one second conducting layer on a portion of the one surface of the insulating substrate, namely the portion where the first insulating layer is to be formed, so as to be thicker than the first conducting layer in thickness, and forming another second conducting layer on a portion of the one surface of the insulating substrate, namely the portion where the second insulating layer is to be formed, so as to be thicker than the first conducting layer in thickness, (c) anodizing the first and second conducting layers, by using the first and second conducting layers as an anode, until the portion of the first conducting layer, which is not covered by the second conducting layer, is completely oxidized to turn the non-oxidized portion of the one second conducting layer into the wiring, the oxidized portion of the one second conducting layer and the oxidized portion of the first conducting layer covering the non-oxidized portion of the one second conducting layer into the first insulating layer covering the surface of the wiring, the non-oxidized portion of the other second conducting layer into the island conductor, and the oxidized portion of the other second conducting layer and the oxidized portion of the first conducting layer covering the non-oxidized portion of the other second conducting layer into the second insulating layer covering the surface of the island conductor.

5. A thin-film diode array, comprising:

an insulating substrate;

a first wiring, formed in a predetermined pattern on one surface of the insulating substrate;

a first anodized insulating layer covering the first wiring;

a second wiring on the first anodized insulating layer;

an electrode formed on the one surface of the insulating substrate; and a diode element formed on the one surface of the insulating substrate adjacent to the second wiring and the electrode, wherein the diode element comprises:

a first terminal spaced from the first wiring, the second wiring, and the electrode;

a second anodized insulating layer covering the first terminal;

a second terminal, a part of which is superimposed on the second wiring and the second anodized insulating layer on the first terminal; and a third terminal, spaced from the second terminal in order to keep electrical isolation, a part of which is superimposed on the second anodized insulating layer on the first terminal and the electrode.

6. A method of manufacturing a thin-film diode array wherein, on one surface of an insulating substrate, there are formed a first wiring of a predetermined pattern, a first insulating layer covering the first wiring, a second wiring on the first insulating layer, an electrode, and a diode element connected to the second wiring and the electrode, the diode element comprising:

a first terminal spaced from the first wiring, the second wiring, and the electrode, a second insulating layer covering the first terminal, a second terminal, a part of which is superimposed on the second wiring and the second insulating layer on the first terminal, and a third terminal, spaced from the second terminal in order to keep electrical isolation, a part of which is superimposed on the second insulating layer on the first terminal and the electrode, the method comprising the steps of:

(a) forming one first conducting layer on a portion of the one surface of the insulating substrate, namely the portion where the first insulating layer is to be formed, and another first conducting layer on a portion of the one surface of the insulating substrate, namely the portion where the second insulating layer is to be formed;

(b) forming a second conducting layer on the one surface of the insulating substrate so that at least a part of the second conducting layer contacts said respective first conducting layers;

(c) anodizing the first and second conducting layers, by using the second conducting layer as an anode, until the second conducting layer is completely oxidized to turn the non-oxidized portion of the one first conducting layer into the first wiring, the oxidized portion of the one first conducting layer and the oxidized portion of the second conducting layer covering the non-oxidized portion of the one first conducting layer into the first insulating layer covering the surface of the first wiring, the non-oxidized portion of the other first conducting layer into the first terminal, and the oxidized portion of the other first conducting layer and the oxidized portion of the second conducting layer covering the non-oxidized portion of the other first conducting layer into the second insulating layer covering the surface of the first terminal;

(d) forming the second wiring on the first insulating layer;

(e) forming the second terminal on the one surface of the insulating substrate so that a part of the second terminal is superimposed on the second wiring and the second insulating layer on the first terminal;

(f) forming, on the one surface of the insulating substrate, the third terminal spaced from the second terminal in order to keep electrical isolation, so that a part of the third terminal is superimposed on the second insulating layer on the first terminal; and (g) forming the electrode on the one surface of the insulating substrate so that a part of the electrode is superimposed on the third terminal.

7. A method of manufacturing a thin-film diode array wherein, on one surface of an insulating substrate, there are formed a first wiring of a predetermined pattern, a first insulating layer covering the first wiring, a second wiring on the first insulating layer, an electrode, and a diode element connected to the second wiring and the electrode, the diode element comprising:

a first terminal spaced from the first wiring, the second wiring, and the electrode, a second insulating layer covering the first terminal, a second terminal, a part of which is superimposed on the second wiring and the second insulating layer on the first terminal, and a third terminal, spaced from the second terminal in order to keep electrical isolation, a part of which is superimposed on the second insulating layer on the first terminal and the electrode, the method comprising the steps of:

(a) forming a first conducting layer on the one surface of the insulating substrate so that a part of the first conducting layer is superimposed on a portion of the one surface of the insulating surface, namely the portion where the first insulating layer is to be formed, and on a portion of the one surface of the insulating substrate, namely the portion where the second insulating layer is to be formed;

(b) forming one second conducting layer on a portion of the one surface of the insulating substrate, namely the portion where the first insulating layer is to be formed, having a thickness larger than that of the first conducting layer, and another second conducting layer on a portion of the one surface of the insulating substrate, namely the portion where the second insulating layer is to be formed, having a larger thickness than that of the first conducting layer;

(c) anodizing the first and second conducting layers, by using the first and second conducting layers as an anode, until the portion of the first conducting layer which is not overlaid by the second conducting layer is completely oxidized to turn the non-oxidized portion of the one second conducting layer into the first wiring, the oxidized portion of the one second conducting layer and the oxidized portion of the first conducting layer covering the non-oxidized portion of the one second conducting layer into the first insulating layer covering the surface of the first wiring, the non-oxidized portion of the other second conducting layer into the first terminal, and the oxidized portion of the other second conducting layer and the oxidized portion of the first conducting layer covering the non-oxidized portion of the other second conducting layer into the second insulating layer covering the surface of the first terminal;

(d) forming the second wiring on the first insulating layer;

(e) forming the second terminal on the one surface of the insulating substrate so that a part of the second terminal is superimposed on the second wiring and the second insulating layer on the first terminal;

(f) forming the third terminal, spaced from the second terminal in order to maintain electrical isolation, on the one surface of the insulating substrate so that a part of the third terminal is superimposed on the second insulating layer on the first terminal; and (g) forming the electrode on the one surface of the insulating substrate so that a part of the electrode is superimposed on the third terminal.

* * * * *